United States Patent
Kurtz et al.

(10) Patent No.: US 7,034,700 B2
(45) Date of Patent: Apr. 25, 2006

(54) SOLID STATE ELECTRONIC PRESSURE SWITCH

(75) Inventors: Anthony D. Kurtz, Ridgewood, NJ (US); Wolf S. Landmann, Fair Lawn, NJ (US); Richard Martin, Ridgewood, NJ (US)

(73) Assignee: Kulite Semiconductor Products, Inc., Leonia, NJ (US)

( * ) Notice: Subject to any disclaimer, the term of this patent is extended or adjusted under 35 U.S.C. 154(b) by 198 days.

(21) Appl. No.: 10/776,707

(22) Filed: Feb. 11, 2004

(65) Prior Publication Data

US 2005/0174247 A1    Aug. 11, 2005

(51) Int. Cl.
*G08B 21/00* (2006.01)
*G01L 9/06* (2006.01)

(52) U.S. Cl. ......................... 340/626; 73/727
(58) Field of Classification Search ................ 340/626, 340/451, 452, 611; 73/715–727, 700
See application file for complete search history.

(56) References Cited

U.S. PATENT DOCUMENTS

| | | | | | |
|---|---|---|---|---|---|
| 3,610,265 | A | * | 10/1971 | McGuinness | 137/818 |
| 3,967,690 | A | * | 7/1976 | Northcutt | 177/25.19 |
| 4,233,848 | A | * | 11/1980 | Sato et al. | 73/727 |
| 4,242,914 | A | * | 1/1981 | Eshelman et al. | 73/711 |
| 4,625,560 | A | * | 12/1986 | Sanders | 73/718 |
| 4,823,117 | A | * | 4/1989 | Burcham | 340/626 |
| 4,858,620 | A | * | 8/1989 | Sugarman et al. | 600/587 |
| 5,349,864 | A | * | 9/1994 | Park et al. | 73/724 |
| 5,817,943 | A | * | 10/1998 | Welles et al. | 73/718 |
| 6,545,610 | B1 | | 4/2003 | Kurtz et al. | 340/626 |

* cited by examiner

*Primary Examiner*—Jeffery Hofsass
*Assistant Examiner*—Anne V. Lai
(74) *Attorney, Agent, or Firm*—Plevy, Howard & Darcy

(57) ABSTRACT

An electronic single pole double throw switch has two states. In each state, one of the lamps is on and the other lamp is off. In the electronic switch, the voltage, which is at the output terminal of the lamp that is off is utilized to drive a low voltage regulator which operates electronic circuitry associated with the electronic switch.

20 Claims, 2 Drawing Sheets

SOLID STATE ELECTRONIC PRESSURE SWITCH

FIELD OF INVENTION

This invention relates to pressure switches in general and, more particularly, to a solid state electronic pressure switch which can be directly substituted for a mechanical single pole double throw (SPDT) switch.

BACKGROUND OF THE INVENTION

As one can ascertain, a pressure switch is a device that closes or opens an electrical contact when a pressure is above or below a certain preset threshold. These switches are utilized in a wide variety of applications, as in automobiles, aircrafts and in various other environments. By connecting the switch to a lamp or an indicator, the operator can discern if the pressure is normal or not. In this manner, a lamp will give a visual indication concerning the monitored pressure. Many pressure switches are electromechanical devices. Such devices typically include a Bourdon tube connected to the pressure source, which tube activates a snap action microswitch. Activation of the switch is associated with the operation of a light or other indicator showing that the pressure to be monitored has been exceeded. These switches are simple and relatively inexpensive, but have some serious disadvantages. For example, there is a poor accuracy of the operation point or the trip point of the switch, poor control of the hysteresis point of the switch. The switches also exhibit poor stability in regard to temperature and time and very often the switches provide poor reliability resulting in contact failures. Such failures can cause the contacts to fail in an open or closed position.

The prior art, of course, is cognizant of these disadvantages and mechanical switches are continuously being replaced by electronic solid state devices. For example, reference is made to U.S. Pat. No. 6,545,610 entitled, "Pressure Transducer and Switch Combination" which issued on Apr. 8, 2003 to A. D. Kurtz et al. and is assigned to Kulite Semiconductor Products, Inc., the assignee herein. In that patent, there is shown a device for providing a plurality of indications of a monitored pressure at a selected value. Basically, the device includes an electronic interface having an input and an output, a resistive structure adapted to measure the pressure and electrically coupled to the interface. There is a first output for providing a signal indicative of the selected pressure and the first output is electrically connected to the output of an electronic interface and a comparator coupled to the output of the electronic interface and adapted to provide a signal indicative of whether the monitored select pressure is greater than a predetermined threshold.

This is an example of an electronic pressure transducer and switch which includes a piezoresistive structure. The characteristic of the electronic switches are significantly better than the mechanical counterparts. This is due to the fact that reliability and stability is very good in regard to such switches and many systems use only electronic switches instead of the prior art mechanical devices. Such prior art mechanical devices are continuously being replaced by electrical switches. One problem is that the prior art mechanical devices are associated with a limited number of terminals, including an output terminal which receives a voltage and terminals associated with the lamp indicator. These are all pre-wired, as for example, in an aircraft or an automobile. Thus, besides replacing such a mechanical switch, one has to be sure that the contacts available for the mechanical switch, as the contacts available in the automobile or the aircraft, or any environment are totally compatible with the electronic switch as well. Accordingly, one should be able to directly replace the mechanical switch with the electronic switch without the utilization of any additional wiring. The purpose is to provide an electronic SPDT switch without making changes to the terminals in the switch operating environment, such as included in the automobile or the aircraft or some other device.

SUMMARY OF INVENTION

An electronic pressure switch which comprises a pressure transducer for providing an output voltage proportional to the magnitude of applied pressure. A comparison means responsive to the output voltage for providing an output comparator signal when the voltage exhibits a predetermined value. A bistable device which has a first and a second output and has an input responsive to the output comparator signal to switch from a first state at the first output to a second state and to switch at the second output from a second state to a first state during the presence of the comparator signal. A first source operating potential adapted to be coupled to the bistable device gating means for providing a pulse of a fixed duration, the gating means coupled to the source of operating potential to provide a gated potential adapted to be applied to the pressure transducer and the comparison means to enable the pressure transducer to provide the output signal during the duration and the comparator means to provide the output signal during the duration, the pulse duration being relatively small to thereby reduce power consumption of the switch due to the operation of the pressure transducer and the comparison means during the pulse duration. The indicator means are coupled to the bistable device to provide an indication indicative of the state of each output of the bistable device.

DETAILED DESCRIPTION OF THE FIGURES

Figure 1:
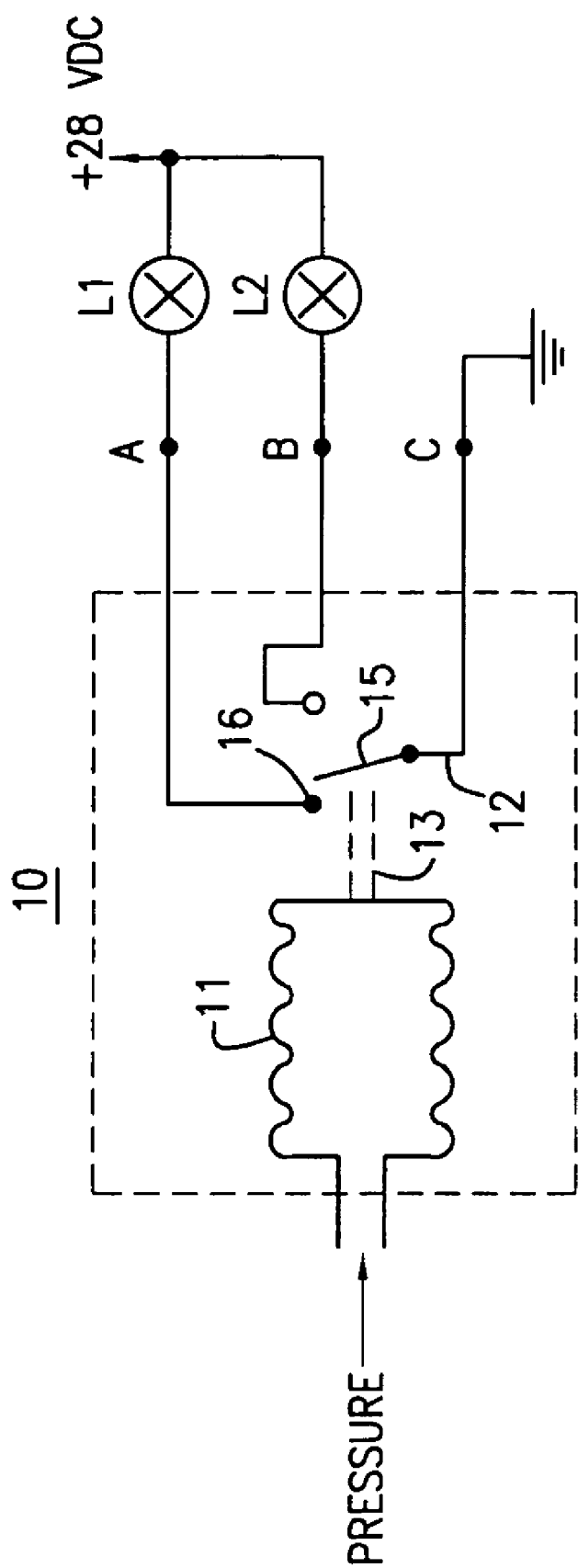
FIG. 1 is a schematic diagram of a prior art mechanical switch useful in explaining this invention.

Referring to FIG. 1 there is shown a prior art mechanical single pole double throw switch 10. As can be seen in FIG. 1, the switch 10 basically consists of a Bourdon tube 11 which receives a pressure at an input port and which Bourdon tube 11 expands or contracts according to the applied pressure. A mechanical rod or other actuating means 13 is shown coupled to a microswitch 12 and is moved by the Bourden tube 11. The microswitch 12 conventionally has a moveable arm 15 which can make contact with terminals 16 and 17. The switch is associated with two lamps designated as L1 and L2. As can be seen in FIG. 1, the lamps are connected to a 28 volt DC source. Of course, 28 volts is indicative of the voltage which may be found in an aircraft or in many other operating environments. It is understood that this voltage could be of a different value, such as 12 VDC and so on. As one can ascertain, the lamps, such as L1 and L2, may be situated on the front panel or control panel of an aircraft or on another control panel. The lamps are associated with terminals A and B and a ground terminal C.

Thus, the mechanical switch, as seen in FIG. 1, is wired whereby the contact 16 is connected to terminal A, contact 17 is connected to terminal B and the moveable contact 15 is connected to terminal C, or reference potential.

Operation of the switch, as shown in FIG. 1, is as follows. At low pressures, when the Bourdon tube 11 is contracted, the switch is in the state shown in FIG. 1. Thus, the moveable contact 15 is in contact with contact 16. As one can ascertain, the moveable contact 15 applies ground to contact 16, which in turn causes incandescent lamp L1 to illuminate. As one can ascertain, lamp L2 is not illuminated because of the position of the movable contact 15. It is, of course, understood that lamps L1 and L2 may be remote from the location of the pressure switch 10. For example, pressure switch 10 may be monitoring an engine function while the lamp and terminals A, B, C may be on a console or some other remote location.

When the applied pressure increases, this causes the Bourdon tube 11 to expand. This moves an actuator 13 to move the moveable contact 15 of the snap action microswitch 12. Therefore, at some predetermined pressure, the switch 12 changes state as forced by the actuating member 13 and therefore, contact 15 switches from contact 16 to contact 17. This causes lamp L1 to turn off and Lamp L2 to turn on. This shows the operator that there is an increase in pressure. When the pressure decreases, the control arm 15 will again go from contact 17 to contact 16, causing lamp L1 to illuminate and lamp L2 to extinguish. As indicated, the switch 12 is a snap action switch and there is a hysteresis between the increasing and decreasing pressure points. This hysteresis is a function of the switch 12, the Bourdon tube 11 operation and can cause substantial differences between various switches as to the switching between contacts 16 and 17.

As one can also ascertain from FIG. 1, the terminals that are available in the existing device would be terminals A, B and C. One would now have to obtain an electronic switch which would be directly wired to terminals A, B and C to replace the prior art mechanical switch 10, as evidenced within the dashed line enclosure, as shown in FIG. 1. The operation has to be identical.

Figure 2:
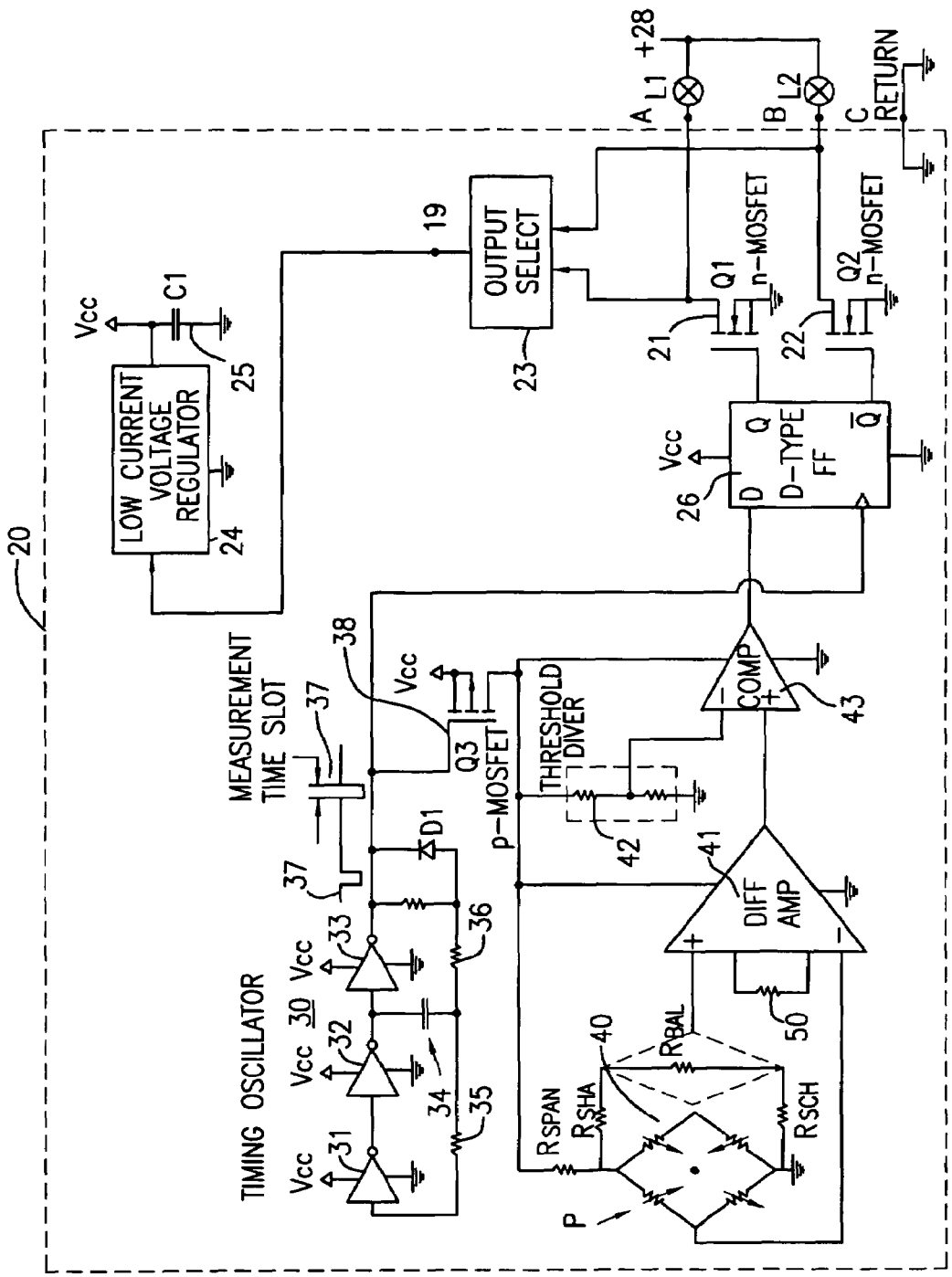
FIG. 2 is a schematic diagram of an electronic switch which can be fully substituted for the mechanical switch of FIG. 1 and according to the teachings of this invention.

Referring to FIG. 2, there is shown a detailed schematic of an electronic switch 20 according to this invention. It is also determined that the electronic switch 20 shown enclosed within the dashed line immediately interfaces with terminals A, B and C which are, again, associated with lamps L1 and L2 and having a common terminal connected to the 28 volt DC supply, or some other supply voltage. The electronic switch 20 contained within the dashed lines can immediately be connected to terminals A, B and C and totally replace the mechanical prior art switch shown in FIG. 1. The operation of the switch will be described. Before proceeding, it will be understood that the electronic SPDT switch 20 has two states. In each state, one lamp is on, such as L1 or L2 and the corresponding switch is closed. In each state, the other lamp is off, with its corresponding switch open. The voltage on the switch terminal A or B that is closed is close to zero or reference potential, while the voltage of the other terminal or pin is equal to the system supply voltage, which is, as indicated, +28 VDC. The idea of the electronic solid state SPDT switch 20 is to draw from a terminal A or B that is at the high voltage a very small current. This current is enough to enable the operation of the electronic circuit. This current has to be small, as it is drawn through a lamp filament, which is off or non-illuminated. This can be accomplished by designing the electronic circuit, such that the current draw is always below the threshold of perceptible light of a lamp as L1 or L2.

One skilled in the art will readily understand as, for example, in a lamp dimming circuit, one can control the intensity of the lamp to a point where even though a current is flowing through the filament, there is no perceptible illumination.

As one can see from FIG. 2, the electronic switch circuit, as indicated, is conventionally coupled or wired to terminals A, B, and C, which terminals exist as, for example, in FIG. 1 in association with the mechanical switch 10. The user having the electronic switch in a closed housing will not know whether the switch is electronic or mechanical, as all terminals are the same. The +28 volt supply, as indicated, is directed through the lamps and is used to bias the source electrodes of a first MOSFET transistor 21 and a second MOSFET 22. The 28 volt supply is applied via the filament of L1 to the source electrode of MOSFET 21. In a similar manner, the 28 volt supply is directed through the filament of lamp L2 and goes to the source electrode of a second MOSFET 22. Both MOSFET's 21 and 22 are N-type MOSFET's, which draw very little current and are very large impedance devices. The terminals A and B, which are connected to the source electrodes of MOSFET's 21 and 22, are directed to the separate inputs of an output select circuit 23. Essentially, the output select circuit may just be a first and second diode or gate, whereby when a voltage is applied from either terminal A or terminal B, that voltage is automatically directed to the input of a low current voltage regulator 24. The output select can also consist of first and second resistors with a common output 19. Each resistor is selected to limit the current drain. The low current voltage regulator 24 takes the 28 volt supply at a low current and produces at an output another voltage Vcc which is stored across capacitor 25. The voltage Vcc is basically a lower voltage than 28 volts at a low current and is used, as will be explained, to bias or activate the various circuits associated with the electronic switch 20.

In order to maintain a low current consumption of the electronic circuits, the circuits, as will be explained, are powered for a very short time, as, for example, one millisecond or less. At the end of the one millisecond time slot, the status of the pressure versus the trip point is evaluated and a corresponding switch is turned on, the switch being indicative of MOSFET's 21 and 22. As one can now ascertain, each switch 21 and 22 has its gate electrode coupled to an output of a D-type flip-flop 26. The flip-flop 26 has a Q and a $\overline{Q}$ output, which conventionally provides a one or a zero output depending on the state of the flip-flop 26. Thus, if the Q output is at a binary one or a positive voltage, switch Q1 will be on, causing lamp A to be illuminated. Switch 22 will be off, causing lamp L2 to be off or in a non-illuminated position. It is understood that in this particular condition, the voltage at terminal A will be approximately zero, as the lamp L1 will have the full 28 volts across it. The voltage at terminal B will be 28 volts. The 28 volts is applied to the input of select circuit 23 which causes the 28 volt signal to be directed to the input of the low current voltage regulator 24, thereby supplying the Vcc voltage across capacitor 25.

The average value of the current, which is drawn through the filament of L2, is of such a magnitude that L2 does not provide visible illumination. The filament resistance of L2 is low when it is not lit, and, as indicated, is lower by more than an order of magnitude than when the lamp is on or even barely lit.

There is shown a timing oscillator 30. Oscillator 30 is a conventional configuration and basically, consists of inverters 31, 32 and 33 arranged in a feed-back loop, whereby the frequency of the oscillator is a function of the capacitor 34 and resistors 35 and 36. The oscillator produces an output signal which is a time slot shown in the waveform depicted by reference numeral 37. This time slot, for example, is approximately one millisecond in duration. As one can ascertain, the time slot signal is applied to the gate electrode of a MOSFET 38. Device 38 is a P-MOSFET and has applied to its source electrode the Vcc voltage from regulator 24. The drain electrode supplies the gated Vcc to the piezoresistive bridge 40, differential amplifier 41, the threshold divider 42 and the comparator 43. This gated Vcc voltage is supplied to those components during the time slot 37. As also seen, the D-type flip-flop also receives this gating signal as a trigger input. Thus, dependent upon the state of the comparator 43, the gating signal 37 would cause the flip-flop 26 to exhibit a transition based on the state of the comparator 43.

The circuit of FIG. 2 operates as follows. As one can ascertain, during the majority of time, the only components that receive the Vcc voltage are the timing oscillator 30, and the flip-flop 26. The remainder of the circuit receives Vcc via the MOSFET 38 during the timing slot 37. Thus, as indicated, during the timing slot, the pressure transducer 40 which receives a pressure via a pressure port as, for example, the pressure port depicted in FIG. 1, produces an output voltage indicative of applied pressure. This voltage is directed to the differential amplifier which then has its output coupled to the positive terminal of the comparator 43. The negative terminal of comparator 43 is coupled to a threshold divider 42. The threshold divider 42 produces a voltage at the negative input which is indicative of a threshold pressure. If the comparator senses that the threshold pressure is exceeded, it will produce an output during time slot 37. This output is provided at the D-input of the flip-flop. The flip-flop receives the triggering pulse during this time period and thus, changes state. In this manner, the state may change from a one at output Q to a one at output $\overline{Q}$. The requisite switch is turned on. Switch 22 being turned on would indicate that the pressure has been exceeded. It is seen that the operation is exactly as depicted in FIG. 1. Thus, in FIG. 1, as shown, during normal operation L1 would be illuminated when the monitored pressure exceeds a predetermined value, L2 would be illuminated and L1 extinguished. In this manner, if the pressure returns to a proper value, L1 would again be illuminated.

Essentially, a major aspect of the operation is the fact that there is always a low current, which is directed through the incandescent lamps L1 and L2. Thus, it should be clear in order to maintain a low current consumption of the electronic circuit, the piezoresistive bridge 40 and other electronic circuits are powered for a very short time. This time, for example, can be one millisecond. At the end of the one millisecond time slot, the status of the pressure versus the trip point is evaluated and switch 21 or 22 is turned on. The status of the pressure is stored in the D-type flip-flop 26, which will continue to drive the selected switch 21 or 22 to the on condition until the next measuring time slot. The time between measuring time slots 37 is much longer than the measuring time slot. For example, the time between pulses 37 can be 100 milliseconds or more. In between the measurements, as indicated, the flip-flop 26, the timing oscillator 30 and the switches 21 and 22, as well as the output select 23 and the low current voltage regulator, are active. The current drawn during this condition is extremely low, as all devices are CMOS devices. Only during the measurement time slot 37 is there a current consumption which is a few milliamps. The average current will reduce the contribution of the measuring time by a factor equal to the duty cycle. For the above-noted values, this is 0.01. As a result, the total average current is very low and most importantly, below the illumination threshold of the lamp. Due to the much longer time constant of the lamp, which is about a second, versus the measurement time, the high current pulses present during the measuring time have no effect and do not result in the associated lamp being turned on. For example, even though there is a significant current drawn during the measurement time slot, the duration is so small that the off lamp will not be energized.

As indicated, the output select circuit 23 operates to provide the voltage regulator 24 with the +28 volt DC signal. This voltage is obtained from a terminal, such as A or B, with the high voltage. As indicated, the lamp draws a small current, which supplies the low voltage regulator. Also seen in FIG. 2 is that the bridge 40 is compensated for temperature effects in a conventional way, utilizing a span resistor RSPAN, shunt resistors, RSHA and RSHC, and the balance resistor RBAL. The bridge output is amplified by the differential amplifier 31. The timing oscillator uses three CMOS inverters and the associated resistors and capacitors for timing. As indicated above, the timing oscillator can use amplifiers or any other devices in a typical feedback loop, or can be a stable multi-vibrator timing circuit or other oscillator. The diode D1 determines the on/off times to be very different, as required by the above-described low duty cycle.

If is, of course, understood that there are many ways that such low duty cycle times can be implemented, including various digital circuits, which do not employ resistors or diodes and can be monolithically implemented. As is clear during the measuring time slot, the voltage Vcc is applied to the bridge, the differential amplifier and comparator through the MOSFET transistor 38. At the end of the measuring time, transistor 38 is turned off. Also at the end of the measurement time, at the rising edge of the pulse, the comparator status 43 is latched in the D-type flip-flop 26.

The voltage regulator is a low quiescent current type, as this current is part of the total average current. The capacitor 25 at the output of the regulator is used to smooth the supply voltage to the circuit. The output of the voltage regulator 24 is set to a low voltage, for example +5 volts, which is suitable for proper operation of the electronics and also low enough to result in low current consumption. The output of the piezoresistor bridge 40, its gage factor, is ratiometric versus the supply voltage. The output of the differential amplifier is also ratiometric, and, the threshold comparator generated by resistor divider, is ratiometric as well. In this manner, the effects of variations of the power supply Vcc are cancelled, as is known.

While the above-described operation shows an embodiment of implementation for the electronic single pole double throw switch, it is understood by one in the art that there are many alternate electronic structures which can be utilized as well. It is seen that the electronic switch of FIG. 2 is a direct replacement for the prior art mechanical switch of FIG. 1 and then, as far as the user is concerned, terminals A, B and C, which already exist, including lamps L1 and L2, are present in the operating environment, such as the automobile, aircraft or other device. They merely substitute switch 20 for switch 10 by connecting terminals A, B and C.

It should be apparent to those skilled in the art that there are other embodiments which may be pertinent and all are deemed to be encompassed within the spirit and the scope of the claims appended hereto.

What is claimed is:

1. An electronic pressure switch comprising:
   a) a pressure transducer for providing an output voltage proportional to the magnitude of applied pressure;
   b) comparison means responsive to said output voltage for providing an output comparator signal when said voltage exhibits a predetermined value;
   c) a bistable device having a first and a second output and having an input responsive to said output comparator signal to switch from a first state at said first output to a second state and to switch at said second output from a second state to a first state during the presence of said comparator signal;
   d) a first source of operating potential adapted to be coupled to said bistable device;
   e) gating means for providing a pulse of a fixed duration, said gating means coupled to said source of operating potential to provide a gated potential adapted to be applied to said pressure transducer and said comparison means to enable said pressure transducer to provide said output signal during said duration and said comparator means to provide said output signal during said duration, said pulse duration being relatively small to thereby reduce power consumption of said switch due to the operation of said pressure transducer and said comparison means during said pulse duration; and
   f) indicator means coupled to said bistable device to provide an indication indicative of the state of each output of said bistable device.

2. The electronic pressure switch according to claim 1 wherein said pressure transducer is a piezoresistive Wheatstone bridge transducer.

3. The electronic pressure switch according to claim 2 further including a differential amplifier having first and second inputs coupled to said bridge and for providing an amplified output voltage at an output of said amplifier.

4. The electronic pressure switch according to claim 3 wherein said comparison means includes a comparator having a first input coupled to said output of said differential amplifier for receiving said amplified output voltage output,
   a threshold level generator to provide a threshold level coupled to a second input of said comparator to cause said comparator to provide said output comparator signal when said output of said differential amplifier exceeds said threshold level.

5. The electronic pressure switch according to claim 4 wherein said bistable device includes a flip-flop having an input coupled to said output of said comparator and operative to change state when said comparator provides said comparator output signal.

6. The electronic pressure switch according to claim 5 further including:
   a first actuatable switch having a control terminal coupled to said first output of said bistable device, said switch operable to provide a low impedance to a point of reference potential when said first output of said bistable device is in said first state and a high impedance when said bistable device is in said second state,
   a second actuatable switch having a control terminal coupled to said second output of said bistable device and said switch operable to provide a low impedance when said second output of said bistable device is in said first state and a high impedance when said bistable device is in said second state.

7. The electronic pressure switch according to claim 6 wherein said indicator means includes a first lamp having first and second terminals, with said first terminal coupled to said first switch to cause said lamp to illuminate when said first switch provides said low impedance and indicative of a normal pressure range,
   a second lamp having first and second terminals with said first terminal coupled to said second switch to cause said lamp to illuminate when said second switch provides said low impedance and indicative of a different pressure range, said second terminal of said first and second lamps connected together and adapted to receive a predetermined lamp operating potential.

8. The electronic switch according to claim 1 wherein said source of operating potential includes a voltage regulator adapted to receive said predetermined lamp operating potential at an input to provide at an output said operating potential of a lower value than said lamp operating potential.

9. The electronic switch according to claim 8 further including an output select circuit having first and second inputs with said first input coupled to said first terminal of said first lamp and said second input coupled to said first terminal of said second lamp to provide at an output said lamp operating potential obtained from said lamp terminal associated with the lamp that is not illuminated, said output coupled to an input of said voltage regulator.

10. The electronic pressure actuatable switch according to claim 1 wherein said first and second switches each include an FET transistor, each having a gate input for selectively activating said FET, a drain electrode coupled to a point of reference potential and a source electrode coupled to said other terminal of said associated lamp, with said gate electrode of said first actuatable FET switch coupled to said first output of said flip-flop and with said gate electrode of said second actuatable FET, coupled to said second output of said flip-flop.

11. The electronic pressure switch according to claim 10 wherein said FETs are MOSFETs.

12. The electronic pressure switch according to claim 11 where said MOSFETs are n-type.

13. An electronic pressure switch for use in a pressure monitoring environment for providing a visual indication of pressure ranges, said visual indication provided by a first and a second incandescent lamp, where said first lamp illuminates during an acceptable monitored pressure range where said second lamp is off, and second lamp illuminates during an unacceptable pressure range where said first lamp is off, said first and second lamps having one terminal connected together and adapted to be connected to a source of potential, said other terminal of each lamp when connected to a point of reference potential will cause the lamp to illuminate when said source of potential is present, said switch comprising:
   a voltage regulator operative to provide an output operating potential, said voltage regulator including means coupled to said other terminal of each lamp to enable said regulator to receive said source of potential when said source is connected to enable said regulator to provide said output operating potential,
   a first actuatable switch coupled between said other terminal of said first lamp and a point of reference potential to enable said first lamp to illuminate when said switch is actuated in an on state,
   a second actuatable switch coupled between said other terminal of said second lamp and to a point of reference potential to enable said second lamp to illuminate when said switch is actuated in an on state, control means coupled to said switches to selectively actuate one switch to said on state with said other switch remaining in an off state in response to a switching signal to cause said associated lamp to illuminate, gating means coupled to said regulator to provide at an output said output operating potential during a predetermining gating interval, pressure monitoring means coupled to said output of said gating means to provide an output pressure signal during said gating interval indicative of a monitored pressure, means responsive to said monitored pressure to provide a switching signal at an output when said monitored pressure exceeds a predetermined value, said switching signal coupled to said control means to selectively activate one of said switches.

14. The electronic pressure switch according to claim 13 wherein said control means comprises a bistable flip-flop having a first output coupled to said first actuatable switch and said second output coupled to said second actuatable switch wherein either said first or second switch is on for one state of said flip-flop with said other switch off for said state.

15. The electronic pressure switch according to claim 13 wherein said pressure monitoring means includes a piezoresistive Wheatstone bridge for providing a voltage proportional to an applied pressure at an output.

16. The electronic pressure switch according to claim 15, further including a differential amplifier coupled to said bridge output to provide at an output an amplified voltage indicative of said applied pressure.

17. The electronic pressure switch according to claim 16 further including a comparator having a first input for receiving a threshold voltage indicative of an alarm pressure value requiring a visual indication from said second lamp, and having a second input coupled to said differential amplifier output to provide a trigger output during said gating interval indicative of said alarm pressure value, said trigger output coupled to an input of said flip-flop to cause said flip-flop to change state, to illuminate said lamp indicative of said alarm state.

18. The electronic pressure switch according to claim 13 wherein said gating means includes an oscillator for providing at an output a gating signal having a predetermined gating pulse interval which is small compared to the gate pulse repetition rate.

19. The electronic pressure switch according to claim 13 further including an output select circuit having a first input coupled to said other terminal of said first lamp and a second input coupled to said other terminal of said second lamp to provide at an output said source of potential for application to said regulator whereby said regulator receives said source of potential independent of which lamp is illuminated.

20. The electronic pressure switch according to claim 13 wherein said switch operates as a single pole double throw (SPDT) switch.

\* \* \* \* \*